(12) United States Patent
Heller

(10) Patent No.: US 6,727,660 B1
(45) Date of Patent: Apr. 27, 2004

(54) ORGANIC ELECTROLUMINESCENT DEVICES AND METHOD FOR IMPROVING ENERGY EFFICIENCY AND OPTICAL STABILITY THEREOF

(75) Inventor: Christian Maria Anton Heller, Albany, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 10/400,859

(22) Filed: Mar. 27, 2003

(51) Int. Cl.[7] .............................. G09G 3/10; H01J 63/04
(52) U.S. Cl. ................................ 315/169.2; 315/169.3; 315/185 R; 313/504
(58) Field of Search .......................... 315/169.2, 169.3, 315/172, 185 R, 193, 209 R, 210, 246; 313/504, 505, 496; G09G 3/10; H01J 63/04

(56) References Cited

U.S. PATENT DOCUMENTS

| | | | |
|---|---|---|---|
| 4,356,429 A | * 10/1982 | Tang | 313/503 |
| 5,294,870 A | 3/1994 | Tang et al. | |
| 5,552,678 A | * 9/1996 | Tang et al. | 315/169.3 |
| 6,023,371 A | 2/2000 | Onitsuka et al. | |
| 6,127,693 A | 10/2000 | Chen et al. | |
| 6,365,270 B2 | 4/2002 | Forrest et al. | |
| 6,366,038 B1 | 4/2002 | Bohm | |
| 6,377,131 B1 | 4/2002 | Langer | |
| 6,380,915 B1 | 4/2002 | Teremy et al. | |
| 6,446,226 B1 | 9/2002 | Voshell et al. | |
| 6,541,924 B1 * | 4/2003 | Kane et al. | 315/246 |

FOREIGN PATENT DOCUMENTS

WO    0199195    12/2001

OTHER PUBLICATIONS

H. Suzuki et al., "Near–Ultraviolet Electroluminescence From Polysilanes," Thin Solid Films, vol. 331, 64–70 (1998).
R. H. Friend, "Optical Investigations of Conjugated Polymers," Journal of Molecular Electronics, vol. 4, 37–46 (1988).
J. Kido et al., "Multilayer White Light–Emitting Organic Electroluminescent Device," Science, vol. 267, 1332 (1995).
F. Garten et al., "Efficient Blue LEDs from a Partially Conjugated Si–Containing PPV Copolymer in a Double––Layer Configuration," Advanced Mater, vol. 9, No. 2, 127 (1997).
A. W. Grice et al., "High Brightness and Efficiency Blue Light–Emitting Polymer Diodes,"Applied Physics Letters, vol. 73, No. 5, 629 (1998).
J. Kido et al., "Organic Electroluminescent Devices Based on Molecularly Doped Polymers," Applied Physics Letters, vol. 61, No. 7, 761 (1992).
G. Klarner et al., "Colorfast Blue Light–Emitting Random Copolymers Derived from Di–n–hexylfluorene and Anthracene", Advanced Mater, vol. 10, No. 13, 993 (1998).

* cited by examiner

*Primary Examiner*—Don Wong
*Assistant Examiner*—Trinh Vo Dinh
(74) *Attorney, Agent, or Firm*—Toan P. Vo; Patrick K. Patnode

(57) ABSTRACT

An organic electroluminescent device ("OELD") has a controllable brightness, an improved energy efficiency, and stable optical output at low brightness. The OELD is activated with a series of voltage pulses, each of which has a maximum voltage value that corresponds to the maximum power efficiency when the OELD is activated. The frequency of the pulses, or the duty cycle, or both are chosen to provide the desired average brightness.

21 Claims, 9 Drawing Sheets

US 6,727,660 B1

ORGANIC ELECTROLUMINESCENT DEVICES AND METHOD FOR IMPROVING ENERGY EFFICIENCY AND OPTICAL STABILITY THEREOF

This invention was first conceived or reduced to practice in the performance of work under contract DE-FC26-00NT40989 awarded by the United States Department of Energy. The United States of America may have certain rights to this invention.

BACKGROUND OF THE INVENTION

The present invention relates generally to light-emitting devices having organic electroluminescent material and, more particularly, to organic electroluminescent devices ("OELDs"), having improved energy efficiency and improved stability of optical output at low drive voltage.

Electroluminescent ("EL") devices, which may be classified as either organic or inorganic, are well known in graphic display and imaging art. EL devices have been produced in different shapes for many applications. Inorganic EL devices, however, typically suffer from a required high activation voltage and low brightness. On the other hand, OELDs, which have been developed more recently, offer the benefits of lower activation voltage and higher brightness in addition to simple manufacture, and, thus, the promise of more widespread applications.

An OELD is typically a thin film structure formed on a substrate such as glass or transparent plastic. A light-emitting layer of an organic EL material and optional adjacent semiconductor layers are sandwiched between a cathode and an anode. The semiconductor layers may be either hole (positive charge)-injecting or electron (negative charge)-injecting layers and also comprise organic materials. The material for the light-emitting layer may be selected from many organic EL materials. The light emitting organic layer may itself consist of multiple sublayers, each comprising a different organic EL material. State-of-the-art organic EL materials can emit electromagnetic ("EM") radiation having narrow ranges of wavelengths in the visible spectrum. Unless specifically stated, the terms "EM radiation" and "light" are used interchangeably in this disclosure to mean generally radiation having wavelengths in the range from ultraviolet ("UV") to mid-infrared ("mid-IR") or, in other words, wavelengths in the range from about 300 nm to about 10 micrometer. Such EM emitted by OELDs can be further modified to produce light having a desired color. For example, modifying EM emitted by OELDs with one or more phosphors can produce white light used for general illumination. In this application, it would be advantageous to provide OELDs having a controllable brightness and improved energy efficiency for brightness control schemes. However, prior-art methods of brightness control by reducing the device drive voltage often lead to flickering when the drive voltage is substantially reduced.

Therefore, it is desirable to provide OELDs, the brightness of which is controllable, and-which have improved energy efficiency and improved stability of optical output when the drive voltage is reduced.

SUMMARY OF THE INVENTION

An organic electroluminescent device ("OELD") of the present invention is capable of producing controllable brightness at improved energy efficiency and improved stability of optical output. The OELD comprises at least an organic EL material disposed between a pair of electrodes.

The present invention also provides a light-emitting system that comprises at least an OELD and a power supply that provides a voltage to the OELD at high frequency.

In one aspect of the present invention, a plurality of OELDs is connected in series in the light-emitting system.

In another aspect of the present invention, a drive voltage is provided in pulses at a high frequency across the organic EL material of the OELD, and each of the drive voltage pulses has a maximum voltage value selected such that it produces an average brightness at the highest power efficiency when the OELD is activated. Power efficiency is defined as radiant energy output of the device per unit electrical energy input. The frequency, the duty cycle, or both are modified to provide a desired level of brightness in the circumstance.

Other features and advantages of the present invention will be apparent from a perusal of the following detailed description of the invention and the accompanying drawings in which the same numerals refer to like elements.

DETAILED DESCRIPTION OF THE INVENTION

The present invention provides a light-emitting device or system, a light source, or a display, the brightness of which is controllable with improved energy efficiency, and the optical output of which has an improved stability at low brightness.

Figure 1:
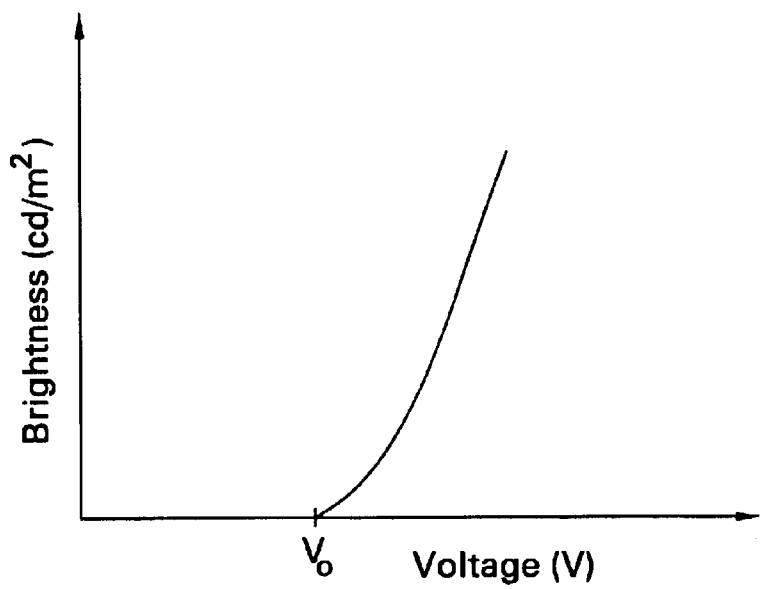
FIG. 1 qualitatively shows a typical graph of brightness versus drive voltage of a typical organic EL material.

OELDs have been contemplated as light sources for general illumination because they can have correlated color temperature ("CCT") in the range of about 2500–7000 K, and color rendering index ("CRI") in the range of about 60–90, comparable to those of fluorescent lamps. For the purpose of general illumination, it is desirable to be able to control the brightness of the light source. FIG. 1 qualitatively shows a graph of brightness versus drive voltage applied across a typical organic EL material. Unless otherwise indicated, the term "brightness" in this disclosure is measured in cd/m$^2$ of active area. Thus, the brightness of a light source comprising an OELD incorporating this organic EL material may be controlled by varying the drive voltage. In particular, the light source may be dimmed by reducing the drive voltage. However, as the voltage is reduced to near V$_0$, a significant percentage of devices might show unstable light output, and the emitted light flickers. This behavior is observed to some extent in all OELDs that incorporate organic EL materials therein, and becomes more likely as the size of the light-emitting area increases. Although Applicant does not wish to be bound by any particular theory, it is believed that this behavior is due to, for example, slightly different conductivity in various parts of the EL materials and/or imperfections in the active organic EL layer. Because of these imperfections, the different parts of the active layer can have different brightness-versus-voltage behaviors, and a voltage may be sufficient to activate a region completely while it may not be sufficient to sustain a continuous emission from another region. The present invention provides a light-emitting system that mitigates this behavior when the brightness of the light-emitting device is reduced. In addition, the present invention also provides a method to operate light-emitting systems based on OELDs at low brightness with improved energy efficiency.

A light-emitting system of the present invention comprises at least an OELD and a power supply that provides voltage pulses to the OELD at high frequency. Each of the voltage pulses has a maximum value selected such that the OELD produces a brightness at its maximum power efficiency when it is operated continuously, the power efficiency being measured by the radiant energy output per unit of electrical energy input. The frequency of the pulses is in the range from about 50 Hz to about 1 GHz (or 10$^9$ Hz), preferably from about 100 Hz to about 1 GHz, and more preferably from about 1 KHz (or 10$^3$ Hz) to about 1 GHz. The duty cycle is selected such that the OLED provides the desired brightness. The duty cycle is defined as $t_{ON}/(t_{ON}+t_{OFF})$ where $t_{ON}$ is the time interval during which the OELD is activated with a power source, and $t_{OFF}$ is the time interval during which the OELD is not activated. For example, the duty cycle can be in the range from about 0.01 to about 0.995. In some embodiments, it may be desirable to operate with a duty cycle in the range from about 0.01 to about 0.5. Under certain circumstances, it may be desirable to have a duty cycle from about 0.01 to about 0.3.

Figure 2:
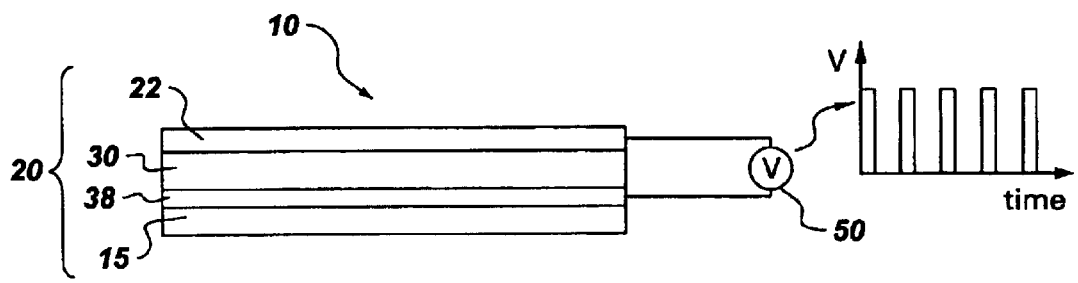
FIG. 2 shows schematically a light-emitting system of the present invention comprising an OELD.
Figure 3:
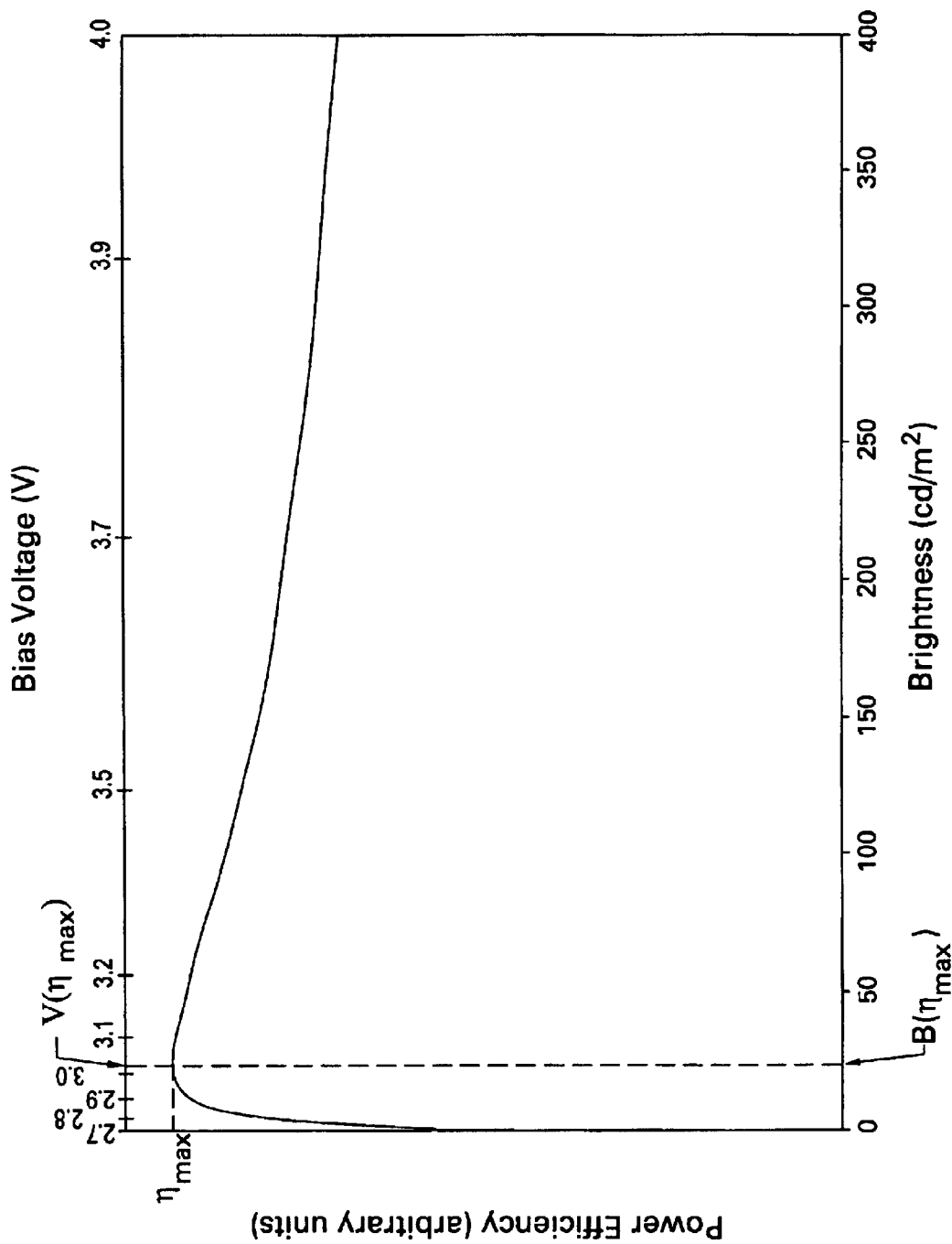
FIG. 3 is a graph showing power efficiency versus brightness of a device made with a blue light-emitting organic polymer.
Figure 4:
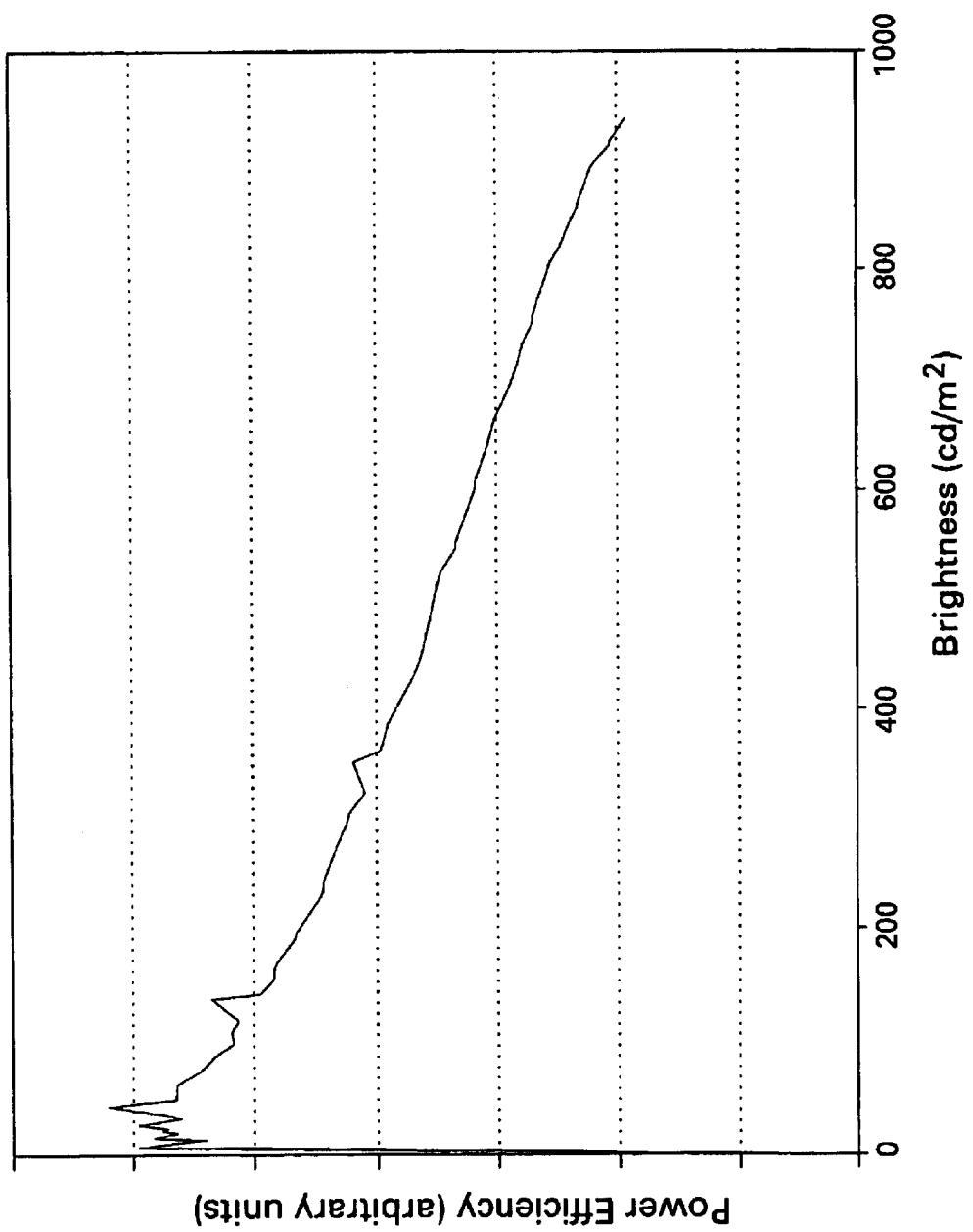
FIG. 4 is a graph showing power efficiency versus brightness of a device made with another blue light-emitting organic polymer.
Figure 5:
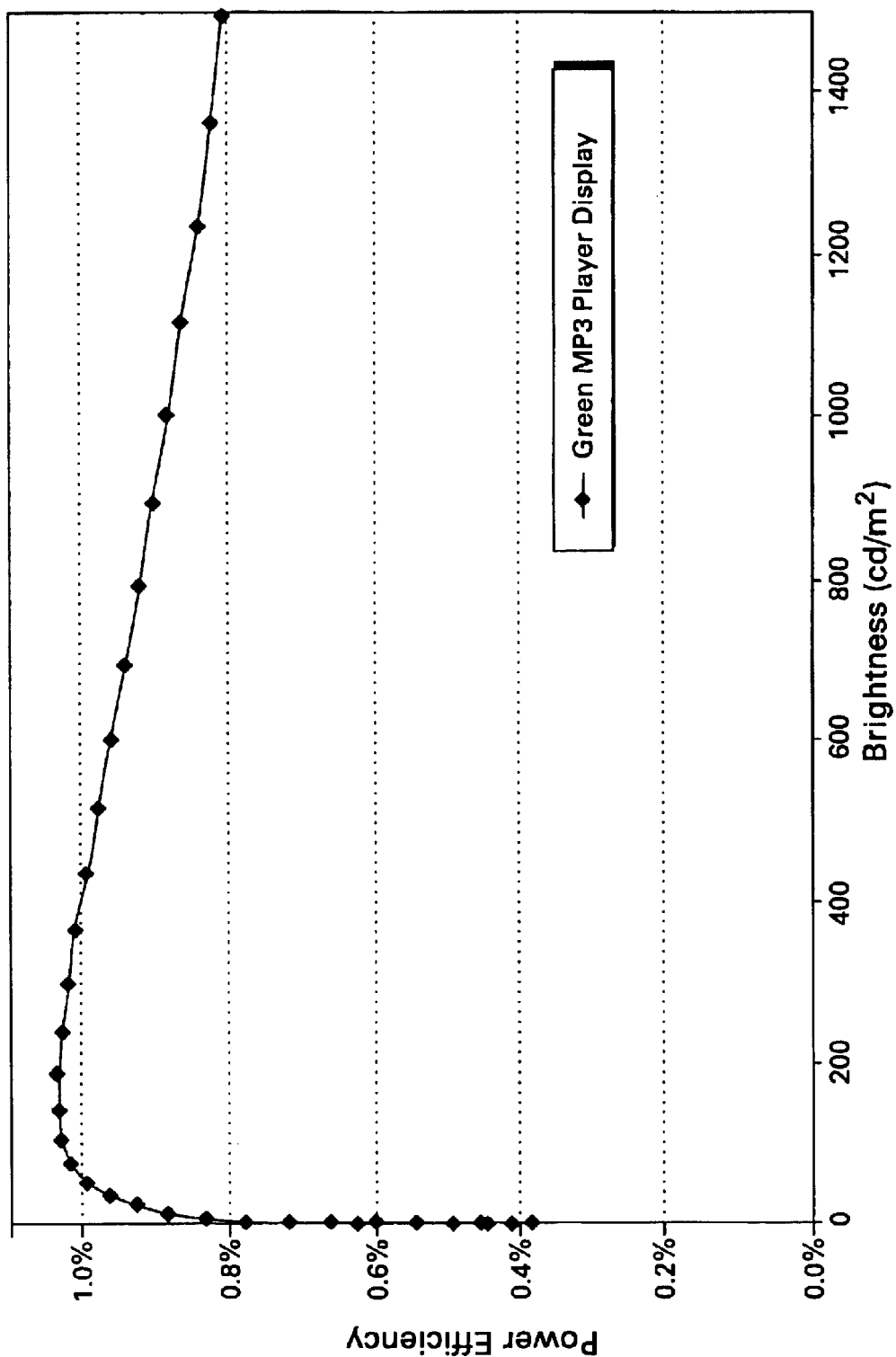
FIG. 5 is a graph showing power efficiency versus brightness of a device made with a green light-emitting organic polymer.
Figure 6:
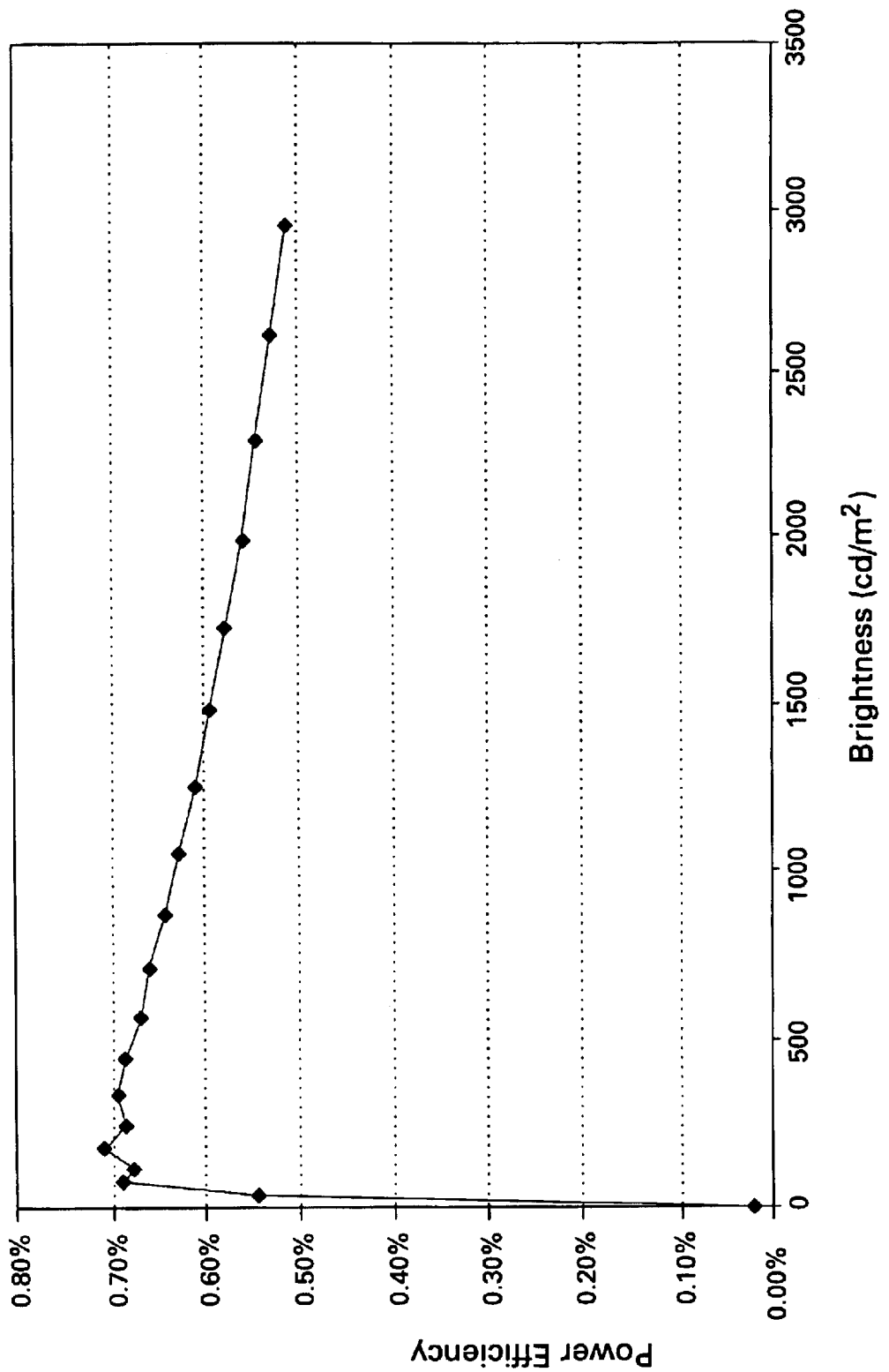
FIG. 6 is a graph showing power efficiency versus brightness of a device made with an orange light-emitting organic polymer.

FIG. 2 shows schematically a typical OELD 10. OELD 10 comprises an organic light-emitting member 20 that comprises a first electrode 22, a second electrode 38, and an electrically and optically active organic EL material 30, which is disposed between electrodes 22 and 38. When a voltage supplied by voltage source 50 is applied across electrodes 22 and 38, light emits from organic EL material 30. Organic EL materials can be chosen to emit light in different wavelength ranges of the visible spectrum, for example, from blue to orange. Typically, OELD 10 is disposed on a substrate 15, which can be made of a substantially transparent material allowing at least 80 percent of light generated in OELD 10 to pass through. Substrate 15 is typically made of glass or a substantially transparent plastic, such as polyethyleneterephthalate ("PET"), polyacrylates, polycarbonate, silicone, epoxy resins, and silicone-functionalized epoxy resins.

In a preferred embodiment, electrode 22 is a cathode injecting negative charge carriers (electrons) into organic EL layer 30 and is made of a material having a low work function; e.g., less than about 4 eV. Low-work function materials suitable for use as a cathode are K, Li, Na, Mg, La, Ce, Ca, Sr, Ba, Al, Ag, In, Sn, Zn, Zr, Sm, Eu, alloys thereof, or mixtures thereof. Preferred materials for the manufacture of cathode layer 22 are Ag—Mg, Al—Li, In—Mg, and Al—Ca alloys. Layered non-alloy structures are also possible, such as a thin layer of a metal such as Ca (thickness from about 1 to about 10 nm) or a non-metal such as LiF, covered by a thicker layer of some other metal, such as aluminum or silver. In this embodiment, electrode 38 is an anode injecting positive charge carriers (or holes) into organic layer 30 and is made of a material having a high work function; e.g., greater than about 4.5 eV, preferably from about 5 eV to about 5.5 eV. Indium tin oxide ("ITO") is typically used for this purpose. ITO is substantially transparent to light transmission and allows at least 80% light transmitted therethrough. Therefore, light emitted from organic electroluminescent layer 30 can easily escape through the ITO anode layer without being seriously attenuated. Other materials suitable for use as the anode layer are tin oxide, indium oxide, zinc oxide, indium zinc oxide, and mixtures thereof. Electrode layers 22 and 38 may be deposited on the underlying element by physical vapor deposition, chemical vapor deposition, or sputtering. A thin, substantially transparent layer of a metal is also suitable.

Although the preferred order of the cathode and anode layers 22 and 38 is disclosed above, the electrode layers may be reversed. Electrode layers 22 and 38 may serve as the anode and cathode, respectively. In this configuration, the thickness of cathode layer 38 is preferably kept to a minimum so that light emitted from organic layer 30 is not seriously attenuated as it travels through cathode layer 38.

Organic EL layer 30 serves as the transport medium for both holes and electrons. In this layer these excited species combine and drop to a lower energy level, concurrently emitting EM radiation in the visible range. Organic EL materials are chosen to electroluminesce in the desired wavelength range. The thickness of the organic EL layer 30 is preferably kept in the range of about 50 to about 300 nm. The organic EL material may be a polymer, a copolymer, a mixture of polymers, or lower molecular-weight organic molecules having unsaturated bonds. Such materials possess a delocalized π-electron system, which gives the polymer chains or organic molecules the ability to support positive and negative charge carriers with high mobility. Suitable EL polymers are poly(n-vinylcarbazole) ("PVK", emitting violet-to-blue light in the wavelengths of about 380–500 nm); poly(alkylfluorene) such as poly(9,9-dihexylfluorene) (410–550 nm), poly(dioctylfluorene) (wavelength at peak EL emission of 436 nm), or poly{9,9-bis(3,6-dioxaheptyl)-fluorene-2,7diyl} (400–550 nm); poly(praraphenylene) derivatives such as poly(2-decyloxy-1,4-phenylene) (400–550 nm). Mixtures of these polymers or copolymers based on one or more of these polymers and others may be used to tune the color of emitted light.

Another class of suitable EL polymers is the polysilanes. Polysilanes are linear silicon-backbone polymers substituted with a variety of alkyl and/or aryl side groups. They are quasi one-dimensional materials with delocalized σ-conjugated electrons along polymer backbone chains. Examples of polysilanes are poly(di-n-butylsilane), poly(di-n-pentylsilane), poly(di-n-hexylsilane), poly (methylphenylsilane), and poly {bis(p-butylphenyl)silane} which are disclosed in H. Suzuki et al., "Near-Ultraviolet Electroluminescence From Polysilanes," 331 Thin Solid Films 64–70 (1998). These polysilanes emit light having wavelengths in the range from about 320 nm to about 420 nm.

Organic materials having molecular weight less than about 5000 that are made of a large number of aromatic units are also applicable. An example of such materials is 1,3,5-tris{n-(4-diphenylaminophenyl) phenylamino}benzene, which emits light in the wavelength range of 380–500 nm. The organic EL layer also may be prepared from lower molecular weight organic molecules, such as phenylanthracene, tetraarylethene, coumarin, rubrene, tetraphenylbutadiene, anthracene, perylene, coronene, or their derivatives. These materials generally emit light having maximum wavelength of about 520 nm. Still other suitable materials are the low molecular-weight metal organic complexes such as aluminum-, gallium-, and indium-acetylacetonate, which emit light in the wavelength range of 415–457 nm, aluminum-(picolymethylketone)-bis { 2,6-di (t-butyl)phenoxide } or scandium-(4-methoxy-picolylmethylketone)-bis(acetylacetonate), which emits in the range of 420–433 nm. For white light application, the preferred organic EL materials are those emit light in the blue-green wavelengths.

More than one organic EL layer may be formed successively one on top of another, each layer comprising a different organic EL material that emits in a different wavelength range. Such a construction can facilitate a tuning of the color of the light emitted from the overall light-emitting device 10.

Furthermore, one or more additional layers may be included in light-emitting member 20 to increase the efficiency of the overall device 10. For example, these additional layers can serve to improve the injection (electron or hole injection enhancement layers) or transport (electron or hole transport layers) of charges into the organic EL layer. The thickness of each of these layers is kept to below 500 nm, preferably below 100 nm. Materials for these additional layers are typically low-to-intermediate molecular weight (less than about 2000) organic molecules. They may be applied during the manufacture of the device 10 by conventional methods such as spray coating, dip coating, or physical or chemical vapor deposition. In one embodiment of the present invention, as shown in FIG. 2, a hole injection enhancement layer 36 is formed between the anode layer 38 and the organic EL layer 30 to provide a higher injected current at a given forward bias and/or a higher maximum current before the failure of the device. Thus, the hole injection enhancement layer facilitates the injection of holes from the anode. Suitable materials for the hole injection enhancement layer are arylene-based compounds disclosed in U.S. Pat. No. 5,998,803; such as 3,4,9,10-perylenetetra-carboxylic dianhydride or bis(1,2,5-thiadiazolo)-p-quinobis (1,3-dithiole).

In another embodiment of the present invention, light-emitting member 20 further includes a hole transport layer 34 which is disposed between the hole injection enhancement layer 36 and the organic EL layer 30. The hole transport layer 34 has the functions of transporting holes and blocking the transportation of electrons so that holes and electrons are optimally combined in the organic EL layer 30. Materials suitable for the hole transport layer are triaryldiamine, tetraphenyldiamine, aromatic tertiary amines, hydrazone derivatives, carbazole derivatives, triazole derivatives, imidazole derivatives, oxadiazole derivatives having an amino group, and polythiophenes as disclosed in U.S. Pat. No. 6,023,371.

In still another embodiment of the present invention, light-emitting member 20 includes an additional layer 24 which is disposed between the cathode layer 22 and the organic EL layer 30. Layer 24 has the combined function of injecting and transporting electrons to the organic EL layer 30. Materials suitable for the electron injecting and transporting layer are metal organic complexes such as tris(8-quinolinolato)aluminum, oxadiazole derivatives, perylene derivatives, pyridine derivatives, pyrimidine derivatives, quinoline derivatives, quinoxaline derivatives, diphenylquinone derivatives, and nitro-substituted fluorene derivatives, as disclosed in U.S. Pat. No. 6,023,371.

Light emitted from light-emitting member 20 can be converted to light having a different color (i.e., different wavelength) by one or more inorganic and/or organic phosphors. The phosphor or phosphors absorb a portion of the light emitted by light-emitting member 20 and emit light having a different wavelength, thereby providing light having a different color. Non-limiting examples of phosphors are aluminates, phosphates, halophosphates, silicates, vanadates, tungstates, and borates that are doped with one or more rare earth metals or transition metals. Other suitable phosphors are organic dyes, such as coumarins, azo dyes, polymethine dyes, phthalocyanine dyes, nitro dyes, or anthraquinone dyes.

FIGS. 3–6 show the power efficiency as a function of brightness for devices made with two blue, a green, and an orange light-emitting organic polymer, respectively. The power efficiency was measured for the operating device as follows. A voltage was applied to the pair of electrodes, and the brightness and power efficiency were measured. Then a different voltage was applied to the device, and the measurement was repeated. Thus, a curve showing power efficiency as a function of voltage or brightness is obtained. Each device shows a maximum power efficiency as brightness, or voltage, increases. For the purpose of discussion herein, the maximum power efficiency is denoted as $\eta_{max}$, and the corresponding brightness and voltage at this maximum power efficiency $\eta_{max}$ are denoted as $B(\eta_{max})$ and $V(\eta_{max})$, respectively.

The present invention is applicable in a situation in which an average brightness less than $B(\eta_{max})$ is desired. In the present invention, a series of voltage pulses is applied across the electrodes of the light-emitting device. Each of the pulses has a voltage value $V(\eta_{max})$ that corresponds to that which gives the maximum power efficiency $\eta_{max}$ and brightness $B(\eta_{max})$ when the device is activated. The series of pulses is applied at a frequency in the range disclosed above in this disclosure. The duty cycle is chosen to provide the desired average brightness less than $B(\eta_{max})$. The frequency and/or duty cycle can be provided as output from an electronic circuit internal to the light-emitting system, using input from the user, such as the action of turning a dimmer switch.

Pulsed voltage can be generated by a combination of a power supply and electronic switches, such as bipolar junction transistors (BJTs), optoelectronic switches, field effect devices (such as junction field effect transistors (JFETs) or metal oxide semiconductor field effect transistors (MOSFETs)), and/or pass gates comprising a plurality of transistors. The design and construction of pulse generators are within the skill of people in the art. Non-limiting examples of configurations for pulse generators are disclosed in U.S. Pat. No. 6,446,226; which is incorporated herein by reference.

Figure 7B:
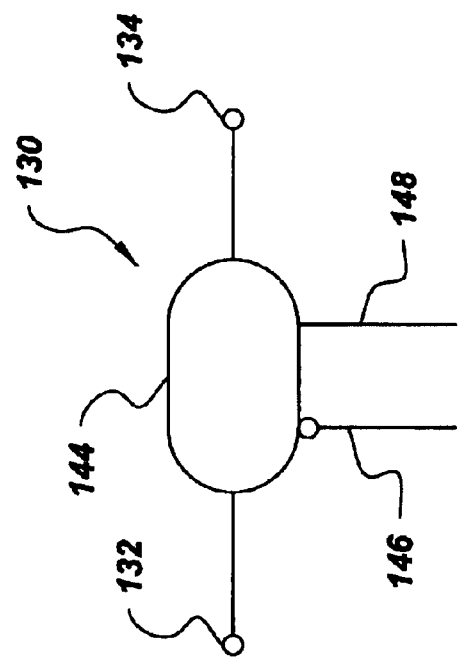
FIG. 7B is a symbolic diagram of the pass gate of FIG. 7A.
Figure 7A:
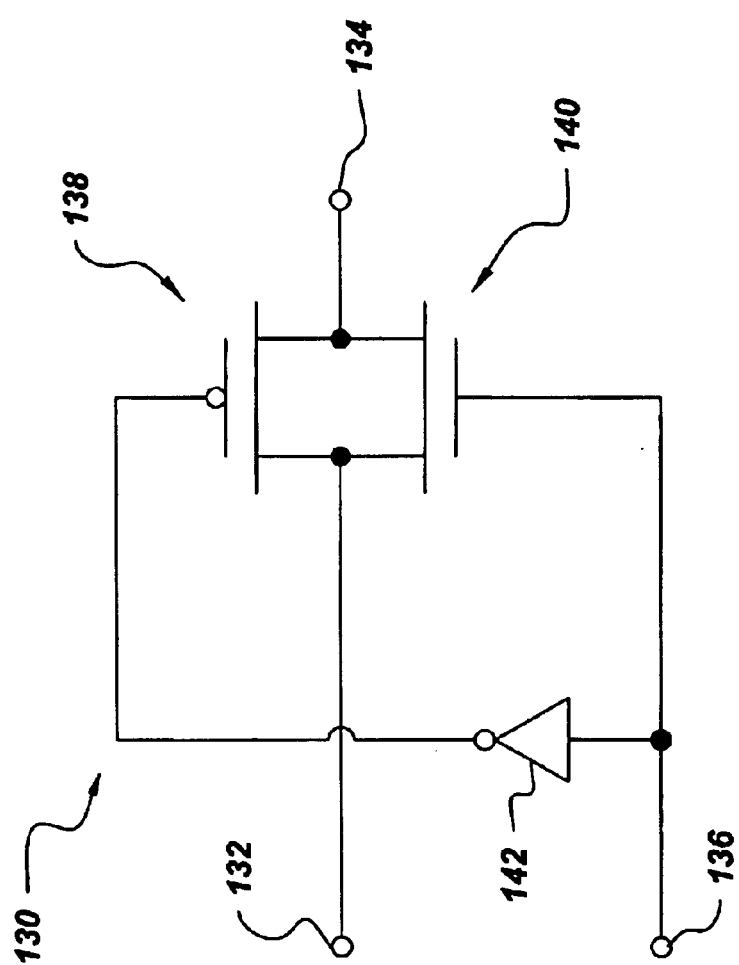
FIG. 7A shows an exemplary pass gate comprising a PMOS and an NMOS.

An example of a pass gate 130 is shown in FIG. 7A. The pass gate 130 is connected between an input terminal 132 and an output terminal 134 and, when rendered conductive by a digital control signal applied to a control terminal 136, the pass gate 130 provides a conductive coupling between the terminals 132 and 134. The pass gate 130 includes a PMOS transistors 138, and an NMOS transistor 140. A voltage source of the PMOS transistor 138 and a source of the NMOS transistor 140 are connected together to the input terminal 132, and a drain of the PMOS transistor 138 and a drain of the NMOS transistor 140 are connected together to the output terminal 134. The control terminal 136 is connected to a gate of the NMOS transistor 140 and to an input of an inverter 142. An output of the inverter 142 is connected to a gate of the PMOS transistor 138.

The pass gate 130 is operated in the following manner. The control signal is applied to the control terminal 36 and thereby to the gate of the NMOS transistor 140 and the input of the inverter 142. The inverter 142 inverts the control signal and applies an inverted control signal to the gate of the PMOS transistor 138. If the control signal is low, both the NMOS transistor 140 and the PMOS transistor 138 are rendered nonconductive. As a result, the pass gate 130 is nonconductive, and a voltage at the input terminal 132 is isolated from the output terminal 134. If the control signal is high, both the NMOS transistor 140 and the PMOS transistor 138 are rendered conductive. As a result, a conductive path is established through the pass gate 130 between the input terminal 132 and the output terminal 134 such that the voltages at the terminals 132 and 134 are rapidly equalized.

A symbolic diagram of the pass gate 130 is shown in FIG. 7B. Elements in FIG. 7B similar to those in FIG. 7A have been given the same reference numerals for purposes of brevity. The pass gate 130 is represented by an oval 144, which is connected between the input terminal 132 and the output terminal 134. A line 146 is connected to the gate of the PMOS transistor 138 and a line 148 is connected to the gate of the NMOS transistor 140. Pass gates are commercially available, for example, from Analog Devices having model numbers ADG411, ADG412, and ADG413. Other equivalents devices, as recognized by people skilled in the art, are also suitable.

The pass gate 130 shown in FIG. 7A reacts rapidly in response to a change in the control signal applied to the control terminal 136. The other types of electronic switches mentioned above provide similar performance advantages. For example, a depletion mode transistor will conduct current when its gate is grounded and is rendered nonconductive when a voltage is applied to its gate. An alternative electronic switch may comprise a single PMOS transistor or a single NMOS transistor, which is rendered conductive with a boosted gate voltage.

Figure 8:
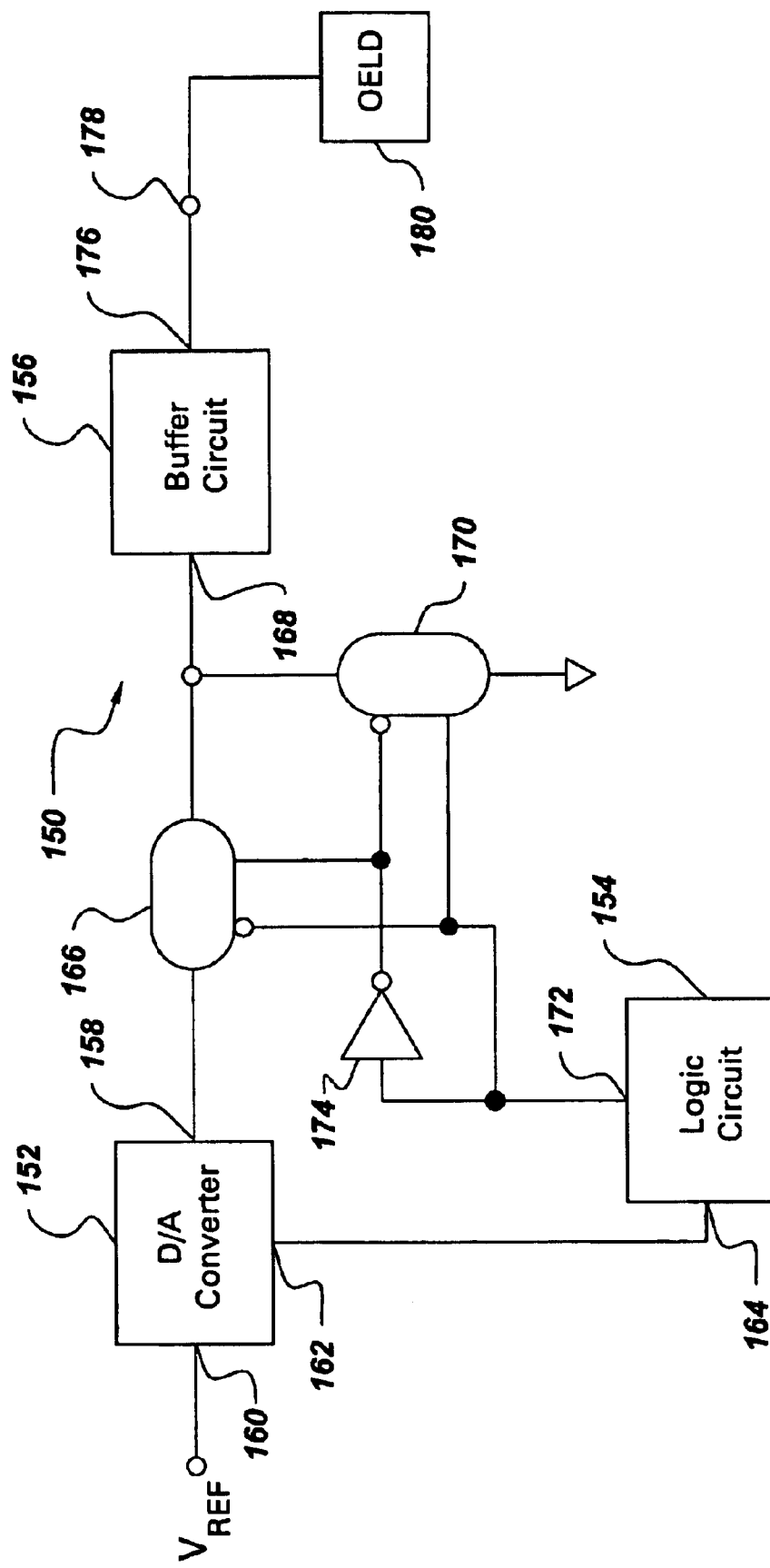
FIG. 8 shows schematically a light-emitting system of the present invention comprising an OELD and a voltage pulse generator based on a pass gate.

A programmable pulse generator 150 according to one embodiment of the invention is shown in FIG. 8. The programmable pulse generator 150 includes a digital-to-analog converter 152, a logic circuit 154, and a buffer circuit 156. A typical digital-to-analog converter is sold by Analog Devices with a model number AD664 or equivalent, as recognized by people skilled in the art. The logic circuit 154 may be any programmable digital circuit such as an FPGA (Field Programmable Gate Array), an ASIC (Application Specific Integrated Circuit), or a microprocessor. A typical buffer circuit is commercially available from, for example, National Semiconductor having model number LH4001. Other equivalent devices, as recognized by people skilled in the art, are also suitable.

The digital-to-analog converter 152 provides a programmable voltage at a port 158, which is derived from a reference voltage $V_{REF}$ received at a port 160. The reference voltage $V_{REF}$ may originate from a band gap reference voltage source, not shown, which is well known to those skilled in the art. The programmable voltage provided at the port 158 is governed by a voltage control signal provided to a port 162 in the digital-to-analog converter 152 from a port 164 in the logic circuit 154. The port 158 is coupled to provide the programmable voltage to an input terminal of a first pass gate 166. An output terminal of the first pass gate 166 is coupled to an input 168 of the buffer circuit 156 and to an input terminal of a second pass gate 170. An output terminal of the second pass gate 170 is connected to a ground voltage reference. A conductive state of each of the pass gates 166 and 170 is controlled by a pass gate control signal provided at a port 172 of the logic circuit 154. The port 172 is connected to a gate of a P-channel transistor in the first pass gate 166 and a gate of an N-channel transistor in the second pass gate 170, and to an input of an inverter 174. An output of the inverter 174 is connected to a gate of an N-channel transistor in the first pass gate 166 and to a gate of a P-channel transistor in the second pass gate 170.

The buffer circuit 156 transfers a voltage at the input 168 to an output 176, which is coupled to an output terminal 178. The output terminal 178 may be coupled to an input of a semiconductor device 180.

The programmable pulse generator 150 is operated to provide voltage pulses from the output terminal 178 to OELD 180 in the following manner. The logic circuit 154 generates the voltage control signal provided from the port 164, which governs the programmable voltage provided by the digital-to-analog converter 152 at the port 158. The upper voltage level of the pulses is thereby governed by the logic circuit 154. The logic circuit 154 generates the pass gate control signal provided at the port 172 to control a conductive state of each of the pass gates 166 and 170. When the pass gate control signal is high, the first pass gate 166 is rendered nonconductive and the second pass gate 170 is rendered conductive to couple the ground voltage reference to the input 168 of the buffer circuit 156. The buffer circuit 156 couples the ground voltage to the semiconductor device 180 through the output terminal 178. Conversely, when the pass gate control signal is low, the first pass gate 166 is rendered conductive while the second pass gate 170 is rendered nonconductive to couple the programmable voltage to the input 168 of the buffer circuit 156, which is coupled to OELD 180. The logic circuit 154 generates the pass gate control signal to be alternately high and low in a sequence to sequentially make each of the pass gates 166 and 170 conductive. The pulses at the output terminal 178 vary between the ground voltage and the programmable voltage provided at the port 158, which is, in turn, governed by the voltage control signal provided at the port 164. The logic circuit 154 may be programmed to generate the pass gate control and voltage control signals according to any one of many well-known methods.

Figure 9:
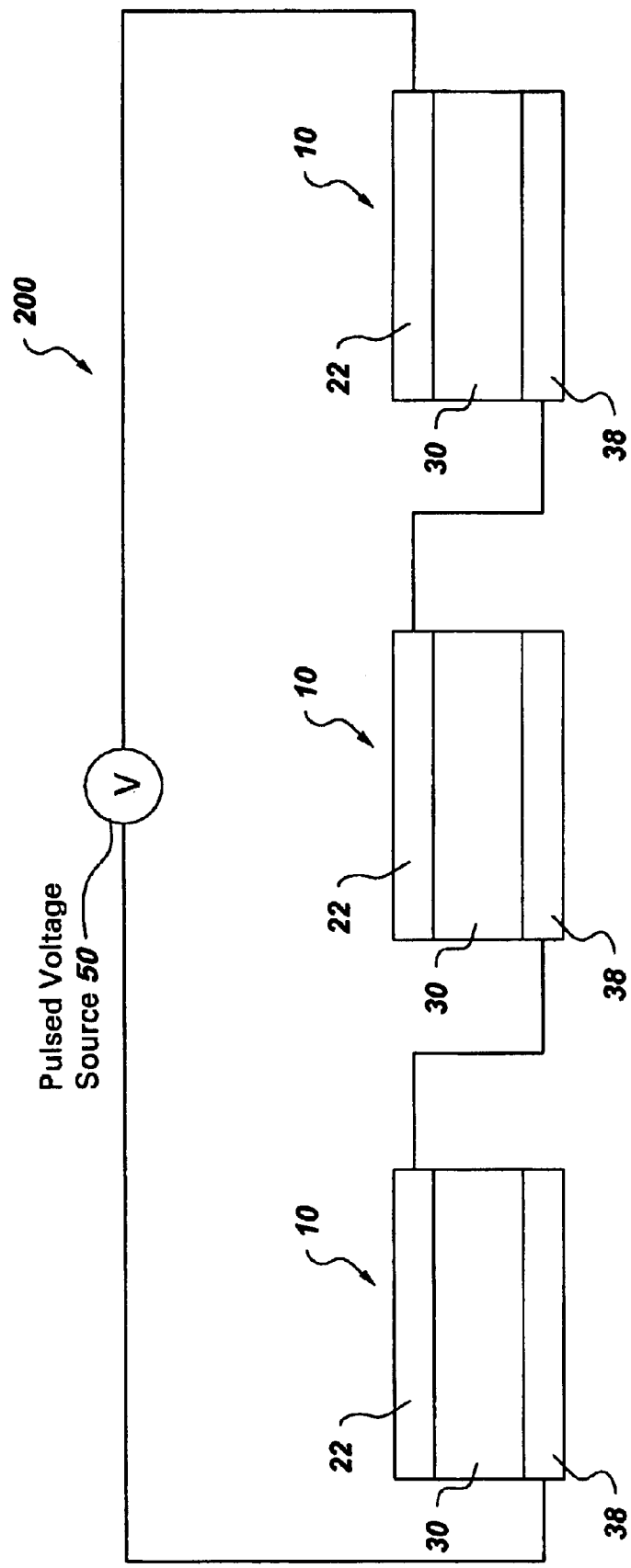
FIGS. 9 and 10 show schematically light-emitting systems of the present invention comprising a plurality of OELDs connected in series and in parallel.

The present invention is also useful in a light-emitting system 200 that comprises a plurality of OELDs 10 connected in series, as illustrated in FIG. 9. Due to small variations in the manufacture of the OELDs 10, when the voltage supplied to a continuously operated light-emitting system 200 is reduced, a voltage across an OELD may be below the value that would sustain a continuous emission, and as a result, the light emitted from this OELD flickers. A high frequency pulsed voltage from voltage source 50 supplied to the light-emitting system 200 comprising OELDs 10 connected in series avoids this problem.

Figure 10:
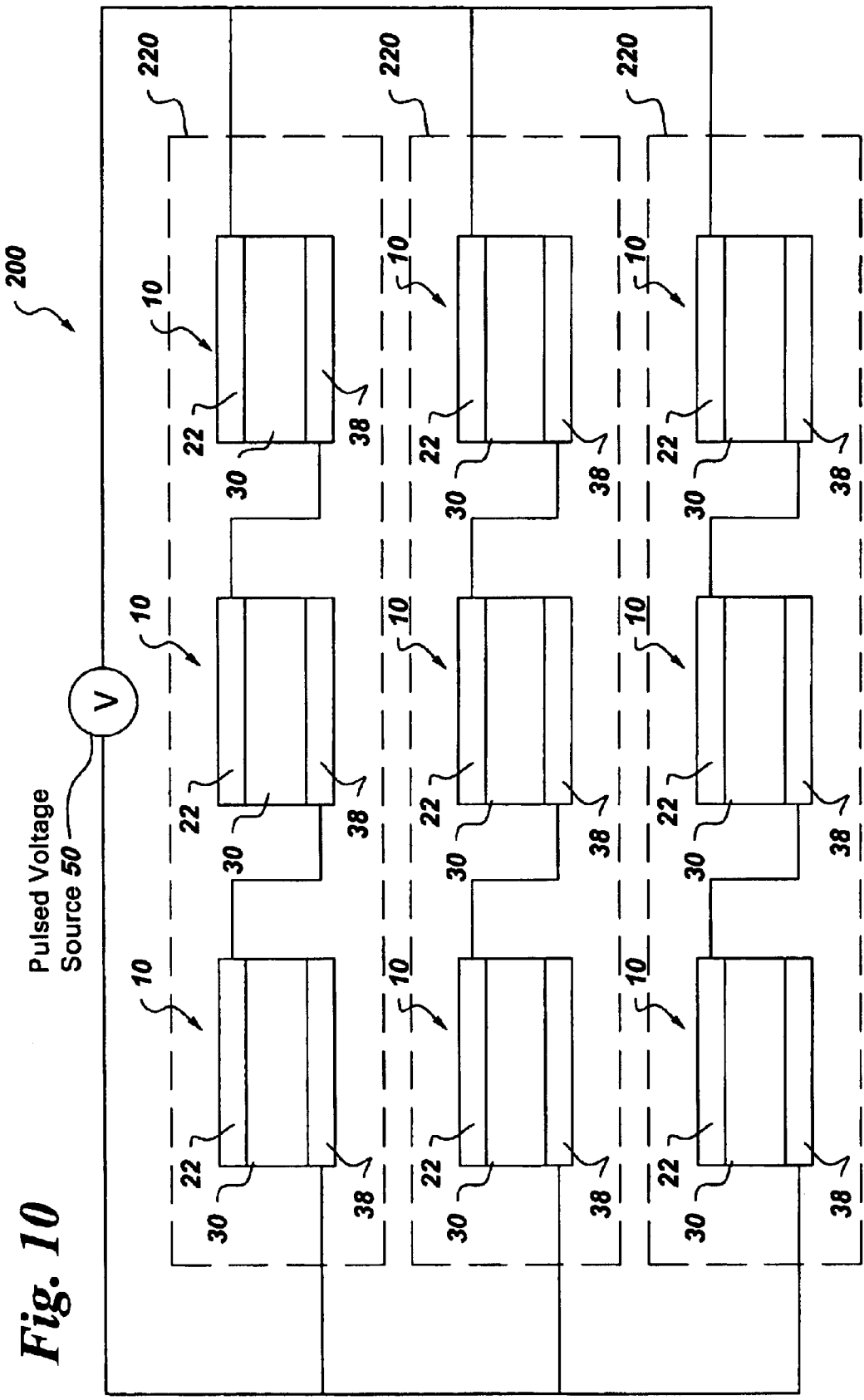

In another embodiment of the present invention, a light-emitting system 200 comprises a plurality of groups 220 of OELDs 10, which groups 220 are connected in parallel, each group 220 of OELDs 10, comprising a plurality of individual OELDs 10 connected in series, as is illustrated in FIG. 10. Each of the plurality of groups 220 receives a voltage pulse. The groups 220 can receive a pulse at the same time. Alternatively, each of the groups 220 in turn can receive a pulse. For example, if the overall device 200 comprises N groups 220 of OELDs 10, each group 220 receives a voltage pulse having a width of $t_{ON}$ during which the group is activated. During the next time interval of $(N-1)t_{ON}$, this group is not activated. Each successive group is activated during the successive time interval $t_{ON}$. When the frequency is high, for example, greater than about 50 Hz, the whole device would appear to a human observer to be activated continuously, and provides a continuous illumination.

While various embodiments are described herein, it will be appreciated from the specification that various combinations of elements, variations, equivalents, or improvements therein may be made by those skilled in the art, and are still within the scope of the invention as defined in the appended claims.

What is claimed is:

1. An electroluminescent ("EL") system comprising:
   at least an organic electroluminescent device ("OELD") that comprises a first electrode, a second electrode, and an organic EL material disposed between said first and second electrodes; and
   a voltage source applying a plurality of voltage pulses at a frequency across said first and second electrodes to activate said organic EL material, wherein each of said voltage pulses has a peak voltage value selected to correspond to a voltage value that provides a maximum power efficiency of said at least an OELD when said at least an OELD is activated with a continuous voltage.

2. The EL system of claim 1, wherein said frequency in a range from about 50 Hz to about 1 GHz.

3. The EL system of claim 1, wherein said frequency in a range from about 1 KHz to about 1 GHz.

4. The EL system of claim 1, wherein said plurality of voltage pulses has a duty cycle that is selected to obtain a desired average brightness from said OELD.

5. The EL system of claim 1, wherein said voltage pulses are generated by a pulse generator comprising at least an electronic switch selected from the group consisting of bipolar junction transistors, optoelectronic switches, junction field effect transistors, metal oxide semiconductor field effect transistors, pass gates, and combinations thereof.

6. An EL system comprising:
   a plurality of organic electroluminescent devices ("OELDs") connected in series, each of which comprises a first electrode, a second electrode, and an organic EL material disposed between said first and second electrodes; and
   a voltage source applying a plurality of voltage pulses at a frequency across a first electrode of a first OELD in said series and a second electrode of a last OELD in said series to activate said organic EL material, wherein each of said voltage pulses has a peak voltage value selected to correspond to a voltage value that provides a maximum power efficiency of an OELD in said series when said OELD is activated with a continuous voltage.

7. The EL system of claim 6, wherein said frequency in a range from about 50 Hz to about 1 GHz.

8. The EL system of claim 6, wherein said frequency in a range from about 1 KHz to about 1 GHz.

9. The EL system of claim 6, wherein said plurality of voltage pulses has a duty cycle that is selected to obtain a desired brightness from said plurality of OELDs.

10. The EL system of claim 6, wherein said voltage pulses are generated by a pulse generator comprising at least an electronic switch selected from the group consisting of bipolar junction transistors, optoelectronic switches, junction field effect transistors, metal oxide semiconductor field effect transistors, pass gates, and combinations thereof.

11. An EL system comprising:
    a plurality of groups of OELDs, said groups being connected in parallel, each of said plurality of groups comprising a plurality of OELDs connected in series, each of said OELD comprising a first electrode, a second electrode, and an organic EL material disposed between said first and second electrodes; and
    a voltage source applying a plurality of voltage pulses at a frequency across a first electrode of a first OELD in a group of OELDs connected in series and a second electrode of a last OELD in said group to activate said organic EL material, wherein each of said voltage pulses has a peak voltage value selected to correspond to a voltage value that provides a maximum power efficiency of an OELD in said series when said OELD is activated with a continuous voltage.

12. A method for improving at least a performance parameter of a light-emitting system, said performance parameter being selected from the group consisting of an energy efficiency, a stability of optical output, and combination thereof, said method comprising:
    (a) providing an EL system that comprises:
        (1) at least an OELD that comprises a first electrode, a second electrode, and an organic EL material disposed between said first and second electrodes; and
        (2) a voltage source capable of generating a plurality of voltage pulses at a frequency; and
    (b) applying said plurality of pulses across said first and second electrodes to activate said organic EL material;
    wherein each of said voltage pulses has a peak voltage value selected to correspond to a voltage value that provides a maximum power efficiency of said at least an OELD when said at least an OELD is activated.

13. The method of claim 12, wherein said frequency is in a range from about 50 Hz to about 1 GHz.

14. The method of claim 12, wherein said frequency is in a range from about 1 KHz to about 1 GHz.

15. The method of claim 12, wherein said voltage pulses are generated by a pulse generator comprising at least an electronic switch selected from the group consisting of bipolar junction transistors, optoelectronic switches, junction field effect transistors, metal oxide semiconductor field effect transistors, pass gates, and combinations thereof.

16. A method for improving at least a performance parameter of a light-emitting system, said performance parameter being selected from the group consisting of an energy efficiency, a stability of optical output, and combination thereof, said method comprising:
    (a) providing an EL system that comprises:
        (1) at least an OELD that comprises a first electrode, a second electrode, and an organic EL material disposed between said first and second electrodes; and
        (2) a voltage source capable of generating a plurality of voltage pulses at a frequency;
    (b) determining a maximum power efficiency of said at least an OELD when said at least an OELD is activated;
    (c) determining a voltage value that provides said maximum power efficiency; and
    (d) applying said plurality of pulses across said first and second electrodes to activate said organic EL material;

wherein each of said voltage pulses has a peak voltage value selected to correspond to a voltage value that provides said maximum power efficiency of said at least an OELD, as determined in step (c).

17. The method of claim 15, wherein said frequency is in a range from about 50 Hz to about 1 GHz.

18. The method of claim 15, wherein said frequency is in a range from about 1 KHz to about 1 GHz.

19. The method of claim 15, wherein said voltage pulses are generated by a pulse generator comprising at least an electronic switch selected from the group consisting of bipolar junction transistors, optoelectronic switches, junction field effect transistors, metal oxide semiconductor field effect transistors, pass gates, and combinations thereof.

20. A method for improving at least a performance parameter of a light-emitting system, said performance parameter being selected from the group consisting of an energy efficiency, a stability of optical output, and combination thereof, said method comprising:
   (a) providing an EL system that comprises:
      (1) a plurality of OELDs that are connected in series, each of said OELDs comprising a first electrode, a second electrode, and an organic EL material disposed between said first and second electrodes; and
      (2) a voltage source capable of generating a plurality of voltage pulses at a frequency;
   (b) determining a maximum power efficiency of an OELD when said OELD is activated;
   (c) determining a voltage value that provides said maximum power efficiency; and
   (d) applying said plurality of pulses across a first electrode of a first OELD in said series and a second electrode of a last OELD in said series to activate said organic EL material;
wherein each of said voltage pulses has a peak voltage value selected to correspond to a voltage value that provides said maximum power efficiency, as determined in step (c).

21. A method for improving at least a performance parameter of a light-emitting system, said performance parameter being selected from the group consisting of an energy efficiency, a stability of optical output, and combination thereof, said method comprising:
   (a) providing an EL system that comprises:
      (1) a plurality of groups of OELDs, said groups being connected in parallel, each of said groups comprising a plurality of OELDs that are connected in series, each of said OELDs comprising a first electrode, a second electrode, and an organic EL material disposed between said first and second electrodes; and
      (2) a voltage source capable of generating a plurality of voltage pulses at a frequency;
   (b) determining a maximum power efficiency of an OELD when said OELD is activated;
   (c) determining a voltage value that provides said maximum power efficiency; and
   (d) applying voltage pulses to said plurality of groups of said OELDs across a first electrode of a first OELD in a group and a second electrode of a last OELD in said group to activate said organic EL material;
wherein each of said voltage pulses has a peak voltage value selected to correspond to a voltage value that provides said maximum power efficiency, as determined in step (c).

* * * * *